US005379190A

United States Patent [19]

Hanamura et al.

[11] Patent Number: 5,379,190

[45] Date of Patent: Jan. 3, 1995

[54] CHIP-TYPE COMPOSITE ELECTRONIC PART AND MANUFACTURING METHOD THEREFOR

[75] Inventors: Toshihiro Hanamura; Kaotu Sakai, both of Kyoto, Japan

[73] Assignee: Rohm Co., Ltd., Kyoto, Japan

[21] Appl. No.: 21,762

[22] Filed: Feb. 24, 1993

[30] Foreign Application Priority Data

Feb. 25, 1992 [JP] Japan ................................ 4-037521

[51] Int. Cl.$^6$ ................................ H05K 1/16

[52] U.S. Cl. ................................ 361/766; 361/763; 361/782; 361/738; 338/195; 338/320

[58] Field of Search ............... 361/763, 766, 782, 767, 361/768, 738; 338/195, 320, 295; 439/68; 174/257, 260

[56] References Cited

U.S. PATENT DOCUMENTS

| | | | |
|---|---|---|---|
| 4,228,418 | 10/1980 | Piedmont et al. | 338/195 |
| 4,906,966 | 3/1990 | Imamura et al. | 338/195 |
| 5,224,021 | 6/1993 | Takada et al. | 361/406 |

*Primary Examiner*—Leo P. Picard
*Assistant Examiner*—Young Whang
*Attorney, Agent, or Firm*—Brumbaugh, Graves, Donohue & Raymond

[57] ABSTRACT

When resistor elements, common electrodes and individual electrodes are formed on a substrate, a disconnected portion, i.e., open portion is formed in one of the common electrodes. After the respective resistor elements are trimmed, the disconnected portion of the one common electrode is bridged by a conductor.

4 Claims, 3 Drawing Sheets

CHIP-TYPE COMPOSITE ELECTRONIC PART AND MANUFACTURING METHOD THEREFOR

BACKGROUND OF THE INVENTION

The present invention relates to chip-type composite electronic parts such as a network resistor and a hybrid IC.

In general, a chip-type network resistor is produced as follows. First, as shown in FIG. 1, common electrodes 4, individual electrodes 5 and resistor films 6 are formed, by printing and baking, on a substrate 1 in which breaking slits 2 and holes 3 have been formed. Then, the respective resistor elements are trimmed with each unit of eight resistor elements employed as a composite part 7. Then, breaking is performed to divide the substrate 1 into rows of composite parts, and side-face electrodes are formed.

FIG. 2 is a circuit diagram of the chip-type network resistor 7 of FIG. 1. For example, an element $R_8$ in FIG. 2 is trimmed while applying a measurement probe is applied to terminals $P_1$ and $P_{10}$ or to terminals $P_6$ and $P_{10}$. However, if the FIG. 2 circuit itself is subjected to the trimming of the element $R_8$, a current flows between the terminals $P_6$ and $P_{10}$ via an element $R_A$, which means a resistance of a parallel circuit of the elements $R_8$ and $R_A$ is measured. Therefore, the trimming of the element $R_8$ cannot be performed. As a countermeasure, the trimming is conventionally performed in a state that the electrode located between the elements of the adjacent parts is opened.

However, this trimming method may cause a conduction defect in forming a side-face electrode 8 because the electrode conductor 5 on the substrate 1 does not reach the end face of the substrate 1 (see FIG. 3). On the other hand, the elimination of the adjacent element will reduce the number of produced parts per substrate, which causes a cost increase. Further, the opening of the electrode will halve a pad area for connection of the measurement probe, which will increase defects.

SUMMARY OF THE INVENTION

The present invention has been made in consideration of the above problems, and has an object of providing a chip-type composite electronic part in which trimming can be performed accurately without causing such problems as a reduction of the number of produced parts per substrate, generation of defects of side-face electrodes and a reduction of a pad area for connection of a measurement probe.

According to the invention, a chip-type composite electronic part comprises:

a substrate;

a plurality of circuit elements, including common electrode and individual electrodes, formed on the substrate, at least one of the common electrodes having a disconnected portion; and a conductor formed at the disconnected portion of the at least one common electrode, for bridging the disconnected portion.

According to a second aspect of the invention, a manufacturing method of a chip-type composite electronic part comprises the steps of:

forming, on a substrate, a plurality of composite electronic component part units each comprising a plurality of circuit elements including common electrodes and individual electrodes, wherein in each of the composite electronic component part units at least one of the common electrodes is opened;

trimming the respective circuit elements; and forming a conductor at an open portion of the at least one common electrode to bridge the open portion.

DESCRIPTION OF THE PREFERRED EMBODIMENT

The present invention is described hereinafter by way of an embodiment.

Figure 4:
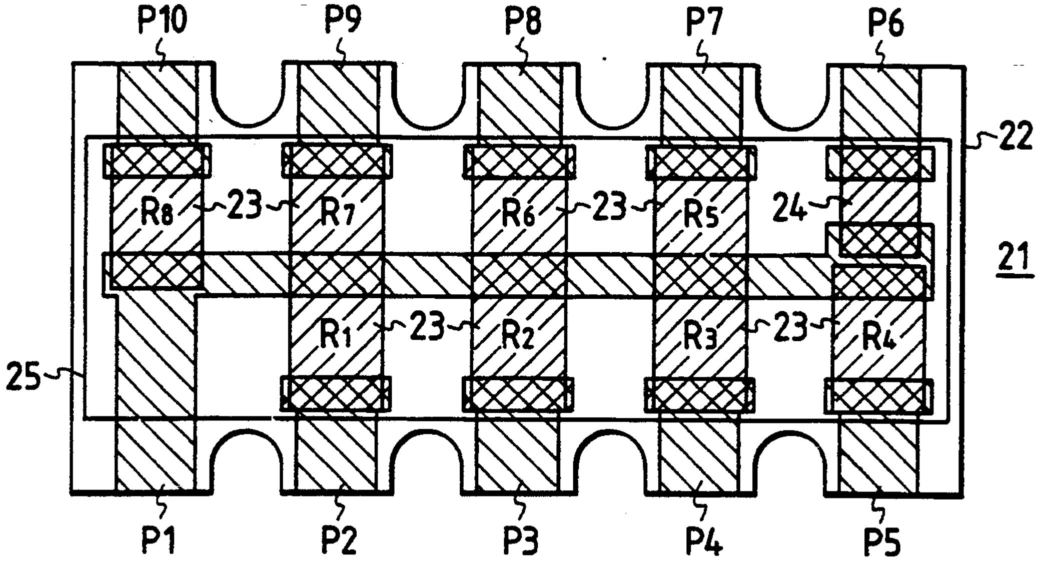
FIG. 4 is a plan view of a network resistor according to an embodiment of the invention.

FIG. 4 is a plan view of a chip-type network resistor according to an embodiment of the invention. A network resistor 21 includes ten electrodes $P_1$–$P_{10}$ in which five electrodes are arranged along each side extending in the longitudinal direction of a substrate 22. The electrodes $P_1$ and $P_6$ are common electrodes, and a resistor film 23 is formed between the common electrode $P_1$ and the respective individual electrodes $P_2$–$P_5$ and $P_7$–$P_{10}$. An open portion is provided between the common electrodes $P_1$ and $P_6$ when the electrodes are formed, and the open portion is bridged by a conductor 24 after the trimming of the respective resistor films 23. Reference numeral 25 represents an overcoat.

Figure 6:
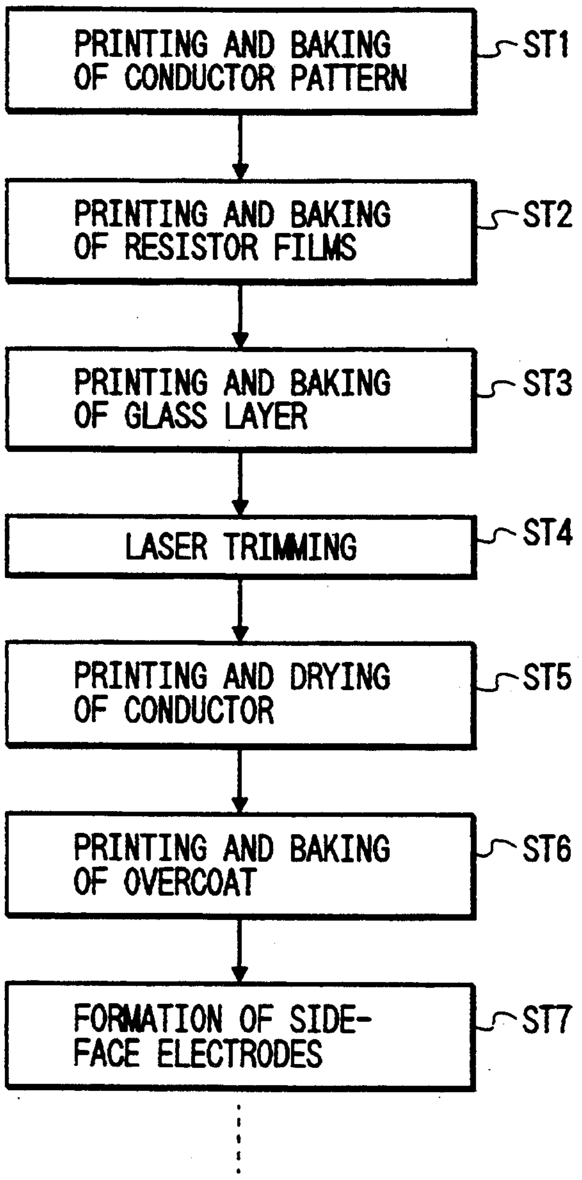
FIG. 6 is a flowchart showing a manufacturing process of the network resistor of FIG. 4.

Next, a manufacturing method of the chip-type network resistor 21 is described with reference to a flowchart of FIG. 6.

Figure 5:
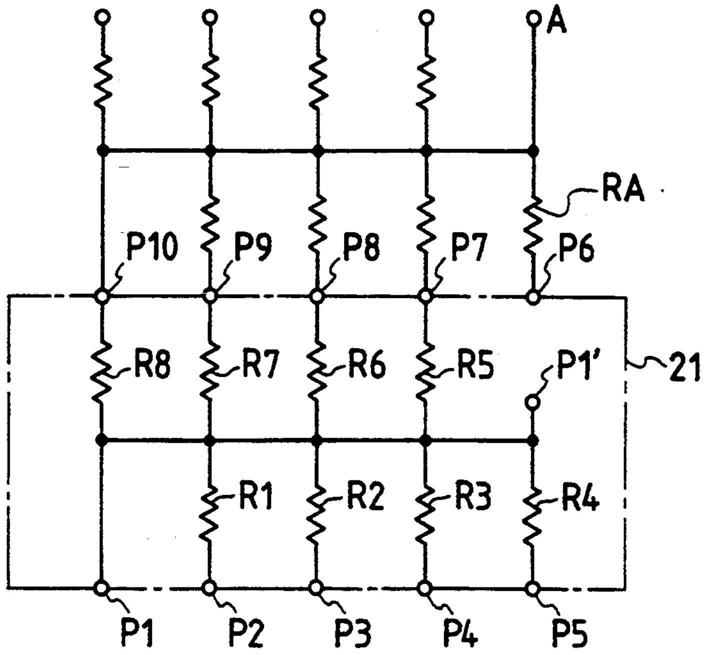
FIG. 5 is a circuit diagram of the network resistor of FIG. 4 at the time of trimming.

In step ST1, a conductor pattern is formed, by printing and baking, on the substrate in which the breaking slits and holes have been formed. In step ST2, the resistor films are formed, by printing and baking, so as to overlap the electrode conductor pattern. After a glass layer as an undercoat is formed by printing and baking in step ST3, the respective resistor elements are subjected to the laser trimming in step ST4. At the trimming stage, since the conductor 24 is not formed yet between the common electrodes $P_1$ and $P_6$, this portion is still in an open state. Therefore, the network resistor at this stage is expressed by a circuit diagram of FIG. 5, in which the line between the terminals $P_1$ and $P_6$ is opened at a point $P_1'$.

As a result, when the resistor $R_8$, for instance, is trimmed, the circuit of the common electrode $P_6$ and the resistor $R_A$, which is in parallel with the resistor $R_8$, is in an open state. Problems due to currents flowing from the terminal $P_1$ to the terminal $P_{10}$ via the resistors $R_5$–$R_7$ can be avoided by applying a bypass-flow-preventing voltage to the individual electrode terminals $P_7$–$P_9$. In this manner, the trimming of the resistor $R_8$ is performed while the resistance of the resistor $R_8$ is measured with the measurement probe being applied to the terminals $P_1$ and $P_{10}$. The trimming of the other resistors is performed in the similar manner.

Figure 1:
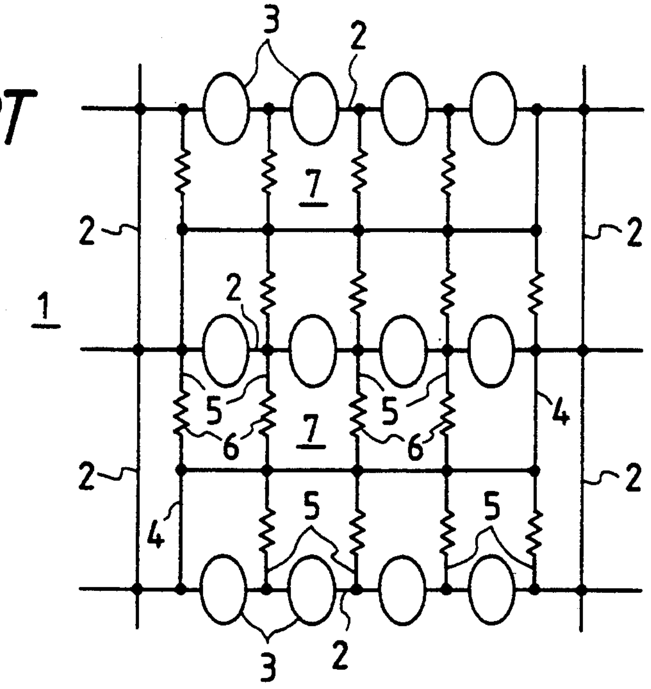
FIG. 1 PRIOR ART
FIG. 1 schematically shows a constitution of a conventional network resistor.
Figure 2:
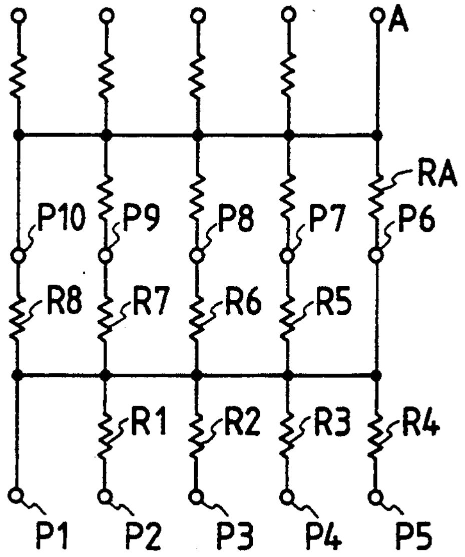
FIG. 2 PRIOR ART
FIG. 2 is a circuit diagram of the network resistor of FIG. 1.
Figure 3:
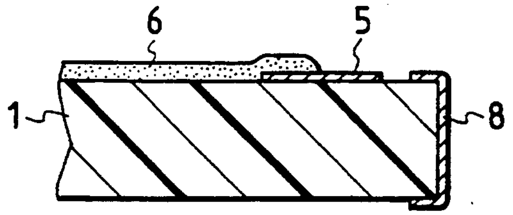
FIG. 3 PRIOR ART
FIG. 3 is a partial sectional view of the conventional network resistor.

After completion of the trimming, in step ST5 the conductor is formed, by printing and drying, between the common electrodes $P_1$ and $P_6$. As a result, the terminals $P_1$ and $P_6$ is electrically bridged, by which the circuit of the network resistor becomes identical to the FIG. 2 circuit.

Subsequently, in step ST6, the overcoat is formed by printing and baking. Then, in step ST7, the substrate is broken along the lines extending in the longitudinal direction of the network resistors to produce bar-shaped substrates, and the side-face electrodes for the respective electrodes are formed. Finally, the bar-shaped substrate is broken to respective network resistors.

It is not always required that the conductor (24 in FIG. 4) be covered with the overcoat. However, if the conductor 24 is covered with the overcoat, the bridging portion can be protected and it can be avoided that steps are formed at the overlapping portions of the electrode conductor pattern and the conductor 24.

If the overcoat (usually made of glass) and the side-face electrodes are of a resin-type, the conductor 24 can also be made of a resin-based material, for instance, a Ag-added epoxy resin. Since these resin materials can be set at a low temperature (not more than 400° C., preferably not more than 200° C.), there exist no high-temperature steps after the laser trimming (ST4). Therefore, the variation of the resistance values after the trimming is very slight, making it possible to provide highly accurate network resistors.

Although the above description is made of the network resistor as an example, the invention can also be applied to other composite electronic parts such as a hybrid IC.

According to the invention, an appropriate portion of the common electrodes is opened in forming the electrodes on the substrate, and the respective circuit elements are trimmed in this state. After completion of the trimming, the conductor is formed to bridge the open portion of the common electrodes. Therefore, the measurement for trimming can be performed without changing the state of the substrate, and defects of the side-face electrodes can be prevented. Since the adjacent composite parts are connected to each other, the substrate can be utilized efficiently. Further, the trimming of the respective circuit elements can be performed accurately while a sufficient the pad area for connection of the laser trimming measurement probe is secured.

What is claimed is:

1. A chip-type composite electronic part comprising:
- a substrate;
- a plurality of circuit elements, including a plurality of common electrodes and a plurality of individual electrodes, formed on the substrate, at least one of the common electrodes having a disconnected portion preventing a parallel circuit connection between another common electrode and at least some of the plurality of circuit elements; and
- a conductor formed at the disconnected portion of the at least one common electrode, for bridging the disconnected portion.

2. The chip-type composite electronic part of claim 1, wherein the chip-type composite electronic part is a network resistor.

3. The chip-type composite electronic part of claim 1, further comprising an overcoat formed over a predetermined area on the substrate including the conductor.

4. The chip-type composite electronic part of claim 1, further comprising an overcoat formed over a predetermined area on the substrate and side-face electrodes formed on side faces of the substrate connected to the respective common and individual electrodes, wherein the conductor, overcoat and side-face electrodes are made of a resin-based material.

* * * * *